United States Patent
Igel et al.

(10) Patent No.: US 7,166,232 B2
(45) Date of Patent: Jan. 23, 2007

(54) METHOD FOR PRODUCING A SOLID BODY INCLUDING A MICROSTRUCTURE

(75) Inventors: Guenter Igel, Teningen (DE); Mirko Lehmann, Freiburg (DE)

(73) Assignee: Micronas GmbH, Freiburg (DE)

( * ) Notice: Subject to any disclaimer, the term of this patent is extended or adjusted under 35 U.S.C. 154(b) by 110 days.

(21) Appl. No.: 10/433,875

(22) PCT Filed: Dec. 21, 2000

(86) PCT No.: PCT/EP00/13066

§ 371 (c)(1),
(2), (4) Date: Jul. 28, 2003

(87) PCT Pub. No.: WO02/50878

PCT Pub. Date: Jun. 27, 2002

(65) Prior Publication Data

US 2004/0147119 A1     Jul. 29, 2004

(51) Int. Cl.
 H01L 21/033   (2006.01)
 H01L 21/768   (2006.01)
 H01L 21/60    (2006.01)
 H01L 21/308   (2006.01)

(52) U.S. Cl. .............. 216/41; 216/46; 216/51; 216/99; 438/542; 438/555; 438/694; 438/696; 438/705; 438/735; 438/743; 438/744; 438/947; 205/123; 205/135

(58) Field of Classification Search ........... 438/555, 438/694, 700, 702, 703, 735, 766, 770, 787, 438/795, 947
See application file for complete search history.

(56) References Cited

U.S. PATENT DOCUMENTS 4,108,738 A * 8/1978 Yi Cho et al. .............. 205/123

(Continued)

FOREIGN PATENT DOCUMENTS

EP      0 412 263      2/1991

(Continued)

OTHER PUBLICATIONS

Siemens AG: "Integrierte Digitalbausteine," 1970, pp. 12-13.

(Continued)

*Primary Examiner*—Anita Alanko
(74) *Attorney, Agent, or Firm*—O'Shea Getz & Kosakowski, P.C.

(57) ABSTRACT

According to a method for producing a solid body (1) including a microstructure (2), the surface of a substrate (3) is provided with a masking layer (6) that is impermeable to a substance to be applied. The substance is then incorporated into the substrate regions not covered by the masking layer (6). A heat treatment is used to diffuse the substance into a substrate region covered by the masking layer (6) such that a concentration gradient of the substance is created in the substrate region covered by the masking layer (6), proceeding from the edge of the masking layer (6) inward with increasing distance from the edge. The masking layer (6) is then removed to expose the substrate region under this layer, and a near-surface layer of the substrate (3) in the exposed substrate region is converted by a chemical conversion reaction into a coating (9) which has a layer thickness profile corresponding to the concentration gradient of the substance contained in this near-surface layer. A supplementary treatment is implemented in a subsection of the coating (9) in which the thickness of the coating (9) is reduced.

14 Claims, 2 Drawing Sheets

U.S. PATENT DOCUMENTS

| | | | |
|---|---|---|---|
| 4,682,408 A | | 7/1987 | Takebayashi ............... 438/449 |
| 5,032,528 A | * | 7/1991 | Asao et al. ................. 438/527 |
| 5,141,883 A | | 8/1992 | Ferla et al. ................ 438/268 |
| 5,144,408 A | * | 9/1992 | Iwasaki ...................... 257/557 |
| 5,171,705 A | | 12/1992 | Choy .......................... 437/41 |
| 6,127,251 A | * | 10/2000 | Gardener et al. ........... 438/585 |
| 6,368,921 B1 | * | 4/2002 | Hijzen et al. ............... 438/270 |
| 6,596,615 B2 | * | 7/2003 | Ipposhi et al. .............. 438/586 |

FOREIGN PATENT DOCUMENTS

JP             2-77135         3/1990

OTHER PUBLICATIONS

Uwe Behringer "Lithographie heute und morgen" F&M Jahrgang 107 (1999), vol. 4, pp. 57-60.

Uwe Behringer "Lithographie heute und morgen" F&M Jahrgang 107 (1999), vol. 9, pp. 40-44.

IBM Technical Disclosure Bulletin, "Method of Forming a Substrate Contact for a Bipolar Memory Cell", vol. 27, No. 11, pp. 6533-6536, Apr. 1985.

Ho et al. "Thermal Oxidation of Heavily Phosphorous-Doped Silicon", J. Electrochem. Soc., 1978. vol. 125, No. 4, pp. 665-671.

* cited by examiner

METHOD FOR PRODUCING A SOLID BODY INCLUDING A MICROSTRUCTURE

BACKGROUND OF THE INVENTION

The invention relates to a method for producing a solid body including a microstructure, especially, a semiconductor element, wherein the surface of a substrate is provided with a masking layer which is impermeable to a substance to be applied, and wherein the substance is subsequently incorporated into substrate regions not covered by the masking layer.

A process of this type is known from the book *Integrierte Digitalbausteine* [Integrated Digital Components], Siemens AG (1970), pages 12 and 13. According to this process, to produce a semiconductor element, a surface region of a silicon substrate is covered by a masking layer which consists of silicon dioxide and is impermeable to a dopant, while other surface regions remain exposed. To create the masking layer, the substrate is first placed in a stream of oxygen where a continuous silicon dioxide layer is formed on the surface of the substrate. A light-sensitive photoresist is then applied to the substrate surface. This photoresist is exposed through a photomask which transmits light at those sites at which the substrate is to remain exposed for doping. After exposure, the photoresist is removed with a solvent from the exposed sites, while the unexposed regions of the photoresist which are insoluble by the solvent remain on the substrate. An etching agent is then used to etch away the silicon dioxide from the resist-free sites, after which the remaining photoresist is removed. The substrate is then exposed at a temperature of approximately 1000° C. to a gas phase containing the dopant, during which the dopant diffuses into the open substrate sites not covered by the silicon dioxide. When the substrate cools, the diffusion process ceases. The substrate has then been doped regionally at the intended sites. The method may be used, for example, to integrate transistors, diodes, or electronic functional elements in the substrate.

The previously known method has the disadvantage, however, that the costs of the exposure device required to expose the substrate increase significantly as the size of the microstructures to be produced decrease—see F&M, Volume 107 (1994), Number 4, pages 57–60, and Number 9, pages 40–44. A principal disadvantageous aspect is that the resolution of the exposure device must be dimensioned for the smallest structure to be produced on the substrate even when large structures are simultaneously generated on the substrate. The production of solid bodies with the smallest structures is therefore complex and expensive.

European Patent 0 412 263 A2 describes a method for producing a via hole in an integrated semiconductor circuit in which according to the method, a mask is used to dope a semiconductor body, and then oxidize the surface of the semiconductor body, thereby creating an oxidation layer which is thicker in the doped semiconductor regions than in the undoped semiconductor regions. An etching process is then used to remove the thinner section of the oxidation layer so as to be able to contact the semiconductor body. IBM Technical Disclosure Bulletin, Volume 27, No. 11, April 1985, pages 6533–6536 discloses an analogous method for producing an insulation layer including regionally thinner sections on a semiconductor body, wherein the semiconductor body is doped through these thinner sections of the insulation layer.

Japanese Patent 02 077135 (Patent Abstracts of Japan) discloses a method in which a gate oxide layer is applied to a silicon substrate. Polysilicon is deposited and structured on this gate oxide layer, a base layer being produced as a mask using the structured polysilicon. A nitride layer is then deposited and structured, a source layer being produced as a mask using the nitride layer. A thick oxide layer is subsequently produced by selective oxidation and the nitride layer is removed, so that a highly doped layer is produced as a mask using the thick oxide layer. An intermediate layer is then deposited, thereby producing a via hole and an electrode.

U.S. Pat. No. 5,171,705 describes a method for producing a DMOS transistor in which a self-adjusting body connection contact is produced.

There is a need for a method which provides inexpensive production of a solid body with a small structure.

SUMMARY OF THE INVENTION

An applied substance is diffused into a substrate layer covered by the masking layer in such a way that a concentration gradient of the substance is created, proceeding from the edge of the masking layer inward with increasing distance from the edge, in the substrate region covered by the masking layer. The masking layer is next removed to expose the substrate region below it. A layer of the substrate near the surface in the exposed substrate region is converted by a chemical conversion reaction into a coating with a layer thickness profile corresponding to the concentration gradient of the substance contained in this near-surface layer; and wherein a supplementary treatment is implemented in a subsection of the coating, the surface of which is smaller than the substrate surface covered by the original masking layer and in which the thickness of the coating is reduced relative to the remaining subsections of the coating, in which treatment the substrate region covered by this subsection is exposed, and/or a material is incorporated into this substrate region through the coating.

As a result of this heat treatment, the region of the substrate including the incorporated substance is thus enlarged, the substance being subdiffused underneath the edge of the masking layer. A concentration gradient with a locus-dependent concentration of the substance is created in the substrate region covered by the masking layer, with the concentration decreasing in the substrate plane running along the interface of the masking layer and substrate, and proceeding from the edge of the masking layer inward with increasing distance from the edge. The coating which was created, after removal of the masking layer, by the chemical conversion reaction of the substrate region originally covered by the masking layer has a thickness at different sites of the substrate layer which corresponds to the concentration of the substance at the respective site. Depending on the chemical conversion reaction selected, the layer thickness of the coating along the substrate plane may either decrease or increase, proceeding from the edge of the substrate layer originally covered by the masking layer toward the interior of this substrate layer. Appropriate chemical conversion reactions are already well known. The supplementary treatment dependent on the layer thickness may be advantageously implemented for the substrate in a given region which is smaller than the region originally covered by the masking layer. During the supplementary treatment of the coating for example, the entire surface of the coating facing away from the substrate may be removed until a subsection of the substrate region originally covered by the coating is exposed at the sites in which the original thickness of the coating was smaller than at the remaining sites of the coating. In addition, however, the supplementary treatment may also incorporate a chemical substance into a subsection of the substrate region covered by the coating through the coating, for example by diffusion or bombardment with particles. In this process, the layer thickness profile of the coating is matched to the diffusion properties of the substance and/or to the kinetic energy of the particles in such a way that the substance is able to penetrate the coating only regionally at those sites where the layer thickness does not exceed a specified thickness.

In a masking layer which was created on the substrate by a photolithographic process, a structure may be produced, the dimensions of which are smaller than the dimensions of the smallest substrate surface still to be masked off from the light or still to be exposed, due to the limited resolution of the exposure device used for the photolithographic process. As a result, a cost-effective exposure device may be advantageously employed which has a lower resolution than that required for the dimensions of the smallest structure to be produced. The method is especially well suited for producing solid bodies that have both small and large structures.

In an advantageous embodiment of the invention, the substrate regions laterally adjoining the masking layer are covered with an etching mask and the masking layer is then contacted with an etching agent. The etching mask is preferably created by a chemical reaction in which a near-surface layer of the substrate regions to be covered by the etching mask is converted into an etching mask material. The etching mask may be applied to the surface regions not covered by the masking layer in a simple manner and without the use of a supplementary photolithographic step. To accomplish this, the near-surface layer may, for example, be converted in a nitrogen atmosphere to a nitride layer resistant to the specific etching agent. The entire surface of the solid body may then be contacted with the etching agent to remove the masking layer. In the event the etching mask is of a greater thickness than the masking layer, another etching agent may be employed which removes the etching mask in addition to the masking layer from the solid body. In this case, the etching rates and the thicknesses of the masking layer and etching mask must be matched to each other in such a way that, after the complete removal of the masking layer by the etching agent, the etching mask still possesses a residual thickness so as to continue to cover the substrate.

It is especially advantageous if the etching mask is created during the heat treatment in an oxygen-containing atmosphere while the substrate material is undergoing oxidation. This allows an additional fabrication step to be eliminated in the production of the etching mask.

It is advantageous if the chemical conversion reaction is an oxidation reaction. The coating may then be generated easily in an oxygen-containing atmosphere and, if required, with the input of energy. In the process, especially in the case of a silicon substrate into which a dopant has been diffused, a clear shaping of the layer profile of the coating is obtained as a function of the concentration gradient of the dopant in the substrate material.

In an advantageous embodiment of the invention, the near-surface layer of the substrate is converted by a chemical conversion reaction into an electrically insulating coating in the substrate region in which the masking layer has been removed. After the regional removal of the coating, a metal coating is electrolytically deposited on the exposed surface of the electrically conductive substrate region. As a result, it is possible, for example, to apply a microelectrode and/or a conductive track of small dimensions onto the substrate. The electrodeposition of the metal coating may be implemented specifically by a currentless technique.

It is advantageous for a preferably metallic surface layer to be applied to the surface of the solid body, and for the adhesive properties of the substrate material and of the coating to be matched to the material of the surface layer such that this layer continues to adhere only to the exposed subsection of the substrate region. The material of the surface layer here is selected so as to adhere more effectively to the exposed subsection of the surface region than to adjacent surface regions of the coating. Any layer regions adhering to the adjacent surface regions after coating may then, for example, be mechanically etched from the surface of the solid body, while the region of the surface layer adhering to the exposed subsection of the substrate region continues to adhere to this region. If required, the surface layer may also be mechanically stressed by the incorporation of impurities. When the layer regions adhering to the coating are detached, cracks may form along the periphery of the surface of the exposed subsection of the substrate region, the cracks facilitating the removal of the regions of this surface layer adhering to the coating.

In one embodiment of the invention, the near-surface layer of the substrate is converted by a chemical conversion reaction to a coating which is impermeable to the chemical substance to be applied. During the supplementary treatment, the substrate region covered by a subsection of this coating is first exposed, then the substance is incorporated into this substrate region. Incorporation of the substance, which may in particular be a dopant for the semiconductor substrate, may, for example, be implemented by diffusion or bombardment with particles—with the substance penetrating the exposed substrate region, while in those regions of the substrate covered by the coating, any penetration of the substance into the substrate is prevented by the coating.

In one embodiment of the invention, a heat treatment is used to diffuse the incorporated substance into a substrate region covered by the masking layer such that, proceeding from the edge of the masking layer inward with increasing distance from the edge of the masking layer, a concentration gradient of the substance is created in the substrate region covered by the masking layer. The masking layer is subsequently removed to expose the substrate region below it. A layer of the substrate near the surface in the exposed substrate region is converted by a chemical conversion reaction into a coating with an appropriate layer thickness profile corresponding to the concentration gradient of the substance contained in this near-surface layer. A supplementary treatment is implemented in a subsection of the coating, the surface of which is smaller than the substrate surface covered by the original masking layer and in which the thickness of the coating is reduced relative to the remaining subsections of the coating, in which treatment the substrate region covered by this subsection is exposed, and/or a chemical substance is incorporated into this substrate region through the coating. The medium, the material of the coating laterally adjacent to the exposed substrate region, and/or the reaction conditions are preferably selected such that no chemical reaction occurs between the medium and the material of the coating. The chemical reaction is then limited to the exposed subsection of the substrate region such that this section may be chemically modified in a targeted fashion.

In one embodiment of the invention, after exposure of the substrate region, the substrate region is contacted with an etching agent for the substrate material, to which the coating surrounding the substrate region is essentially chemically resistant, in order to insert a depression in the substrate region. The coating then forms an etching mask for the etching agent. An anisotropic etching agent may be used to insert a groove with a roughly V-shaped cross-section into the substrate region. The solid body may be a component of a microreactor, the etched depression forming, for example, a supply channel for a substance to be inserted into the chamber of the microreactor, and/or forming a discharge channel for a substance to be discharged from the chamber. A metallic material is preferably used as the substrate for one component of the microreactor, for example aluminum or silver, which material provides effective dissipation of heat from or into the chamber of the microreactor.

These and other objects, features and advantages of the present invention will become more apparent in light of the following detailed description of preferred embodiments thereof, as illustrated in the accompanying drawings.

DETAILED DESCRIPTION OF THE INVENTION

Figure 2:
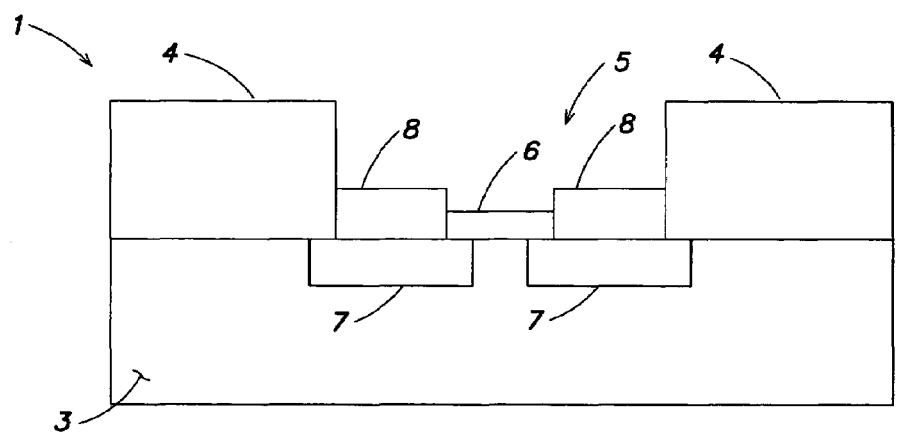
FIG. 2 shows the solid body seen in FIG. 1 after a heat treatment in which the doping material is diffused underneath the masking layer.

In a method for producing a solid body 1 with a microstructure in the form of a semiconductor element, a substrate 3 that includes preferably silicon is provided, which substrate has passivation layers 4 that include silicon dioxide on its surface, the layers covering the substrate 3 continuously. Using a known method such as photolithographic application of an etch-resistant mask and followed by a wet etching process, an opening 5 is incorporated into the passivation layer 4, the opening exposing a subsection of the substrate 3. To produce a masking layer 6, a silicon nitride layer is applied through the opening 5 by a coating method such as chemical vapor deposition, over the entire substrate region exposed in the opening 5. Subsequently, an etching mask resistant to an etching agent such as phosphoric acid is applied to this layer by a photolithographic procedure, which mask covers certain regions of the silicon nitride layer. The solid body 1 is then contacted with the etching agent to remove those regions of the silicon dioxide layer not covered by the etching mask. The etching mask is then removed. It is evident in FIG. 2 that the regions of the silicon nitride layer remaining on the substrate 3 form the masking layer 6 which covers a subsection of the substrate region located in the opening 5, and that this masking layer 6 is spaced laterally on both sides of the passivation layer 4. The material of the masking layer 6 is selected based on its impermeability to a substance provided for doping the substrate, for example boron or phosphorus.

Figure 1:
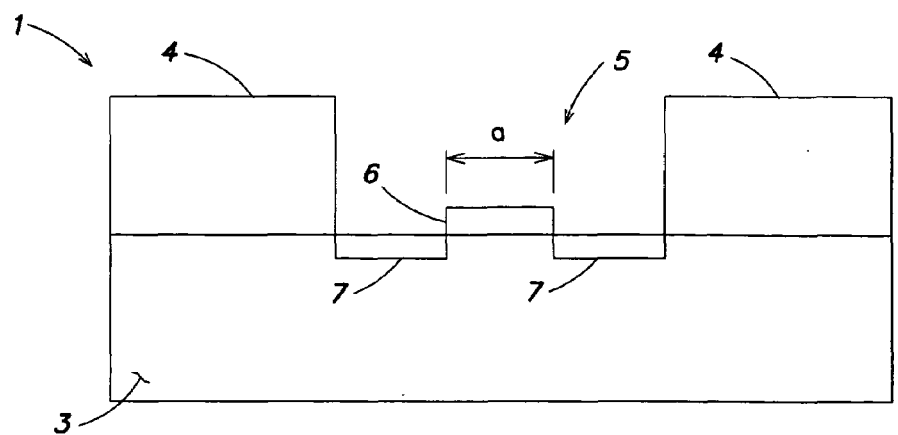
FIG. 1 is a cross-section through a solid body provided to produce a semiconductor element, into the substrate of which doping regions are incorporated laterally on both sides of the masking layer.

After the masking layer 6 is produced, this substance is inserted into the opening 5 to dope the substrate regions not covered by the masking layer 6. This may be accomplished for example by exposing the solid body 1 to a gas stream containing the substance. The substance then diffuses into the substrate regions not covered by the masking layer 6 where it forms doping zones 7 (FIG. 1).

After and/or during the incorporation of the substance into the doping regions 7, a heat treatment is implemented in which the incorporated substance is diffused into a substrate region covered by the masking layer 6. The heat treatment may be performed at a temperature of, for example, 1000° C. It is clearly evident in FIG. 2 that the doping regions 7 have expanded relative to FIG. 1 and that the dopant has sub-diffused underneath the edge of the masking layer 6. Upon completion of the heat treatment, there is a decrease in the concentration of the substance in the coverage plane of the doping regions 7, proceeding from the masking layer 6 into the substrate region covered by the masking layer 6 and with increasing distance from the edge of the masking layer.

During the heat treatment, the solid body 1 is exposed to an oxygen-containing atmosphere in which an oxide layer is deposited in the opening onto the substrate region not covered by the masking layer 6, the oxide layer forming an etching mask 8 which is resistant to an etching agent, such as phosphoric acid, used to remove the masking layer 6. After completion of the heat treatment, the masking layer 6 is contacted with this etching agent to remove the masking layer 6, thus exposing the substrate region located under the masking layer 6.

Figure 3:
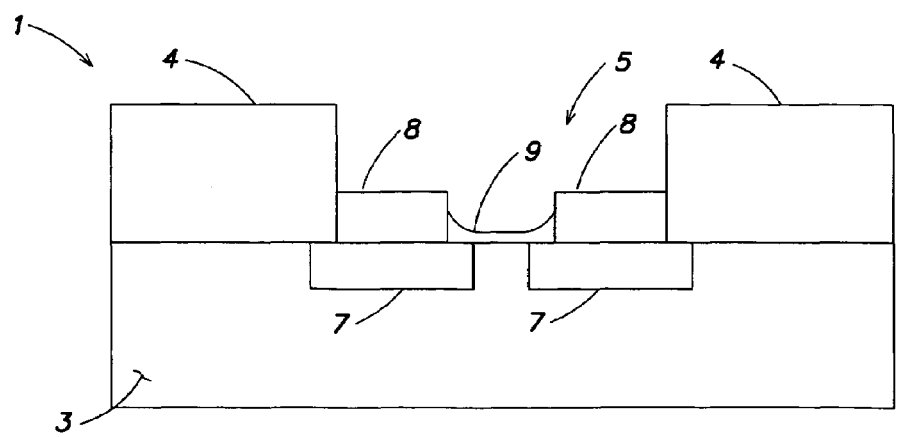
FIG. 3 shows the solid body seen in FIG. 2 after removal of the masking layer and subsequent application of a coating including a thickness profile.

Next, a layer of substrate 3 located under the exposed substrate region is converted by a chemical conversion reaction in an oxygen-containing atmosphere into a silicon dioxide coating 9. The local thickness of this coating 9 is dependent on the concentration of the substance diffused into the specific substrate region taking part in the chemical conversion reaction. It is clearly evident in FIG. 3, that the thickness of the coating 9 decreases proceeding from the edge of the coating 9 toward the center of the coating 9, specifically, in accordance with the respective decrease in concentration of the substance in the substrate 3.

Figure 4:
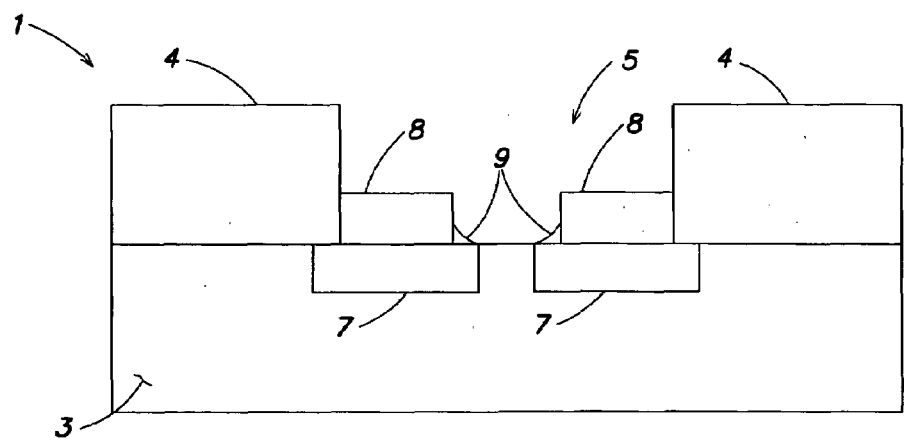
FIG. 4 shows the solid body seen in FIG. 3 after the etching process in which the coating has been removed regionally from the substrate.

In the embodiment of FIG. 4, the coating 9 is exposed to an etching agent which etches away the material from the surface of the coating 9 facing away from the substrate 3. The etching process is stopped when a subsection of the coating 9, in which the original thickness of the coating 9 relative to the adjacent subsections of the original coating 9 is reduced, is completely removed, and the substrate 3 covered by this subsection is exposed. It is evident from FIG. 4 that after completion of the etching process, the substrate region covered by the original masking layer 6 remains covered by the coating 9 only along its peripheral regions, and that a substrate region which is smaller than the substrate region covered by the original masking layer 6 has been exposed. While near-surface layers are also removed during the etching of the coating 9 from the passivation layer 4 and the etching mask 8, the thickness of the passivation layer 4 and that of the etching mask 8 are adjusted to be large enough so only part of their thickness is etched away, and, as a result, the substrate material located beneath them continues to remain covered after completion of the etching process.

Figure 5:
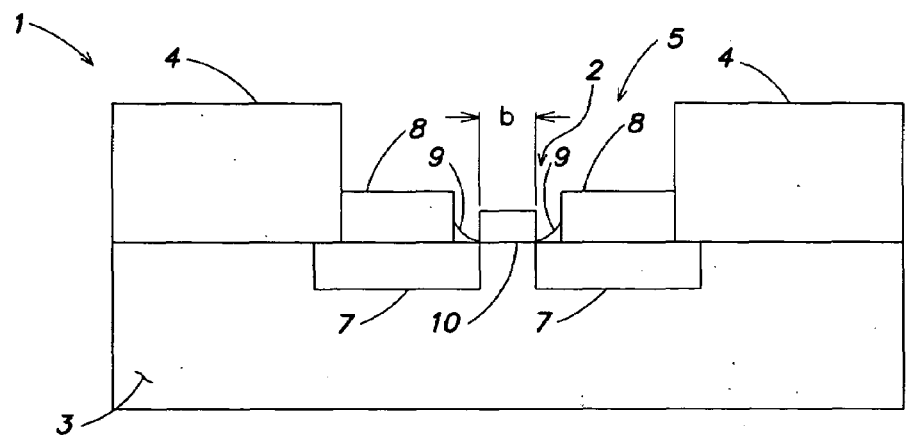
FIG. 5 shows the solid body seen in FIG. 4 after the selective application of a metal coating.

In the embodiment of FIG. 5, the coating 9 includes an electrically insulating material. After regional removal of the coating 9, a metal layer 10 is electrolytically deposited on the exposed surface of the substrate 3, which layer may form, for example, an electrode or a conductive track. It is clearly evident from FIG. 5 that the dimensions "b" of the metal layer 10 are smaller than the dimensions "a" of the original masking layer 6. The method may thus be employed to produce a microstructure 2, the dimensions of which are smaller than the resolution of an exposure device used during the photolithograph processing applied to the masking layer 6. As a result, the additional costs otherwise required for a high-resolution exposure device may be eliminated.

A substance may be incorporated into the substrate region exposed by the regional removal of the coating 9. The material of the coating 9 is selected based on the fact that the residual amount of the coating 9 remaining on the substrate 3 after exposure of the substrate region is impermeable, at least regionally, to the substance to be incorporated. In order to incorporate the substance, the solid body is contacted with a substance, for example in a gas phase, that essentially diffuses only into the exposed substrate regions while the remaining substrate regions remain free of the substance.

Figure 6:
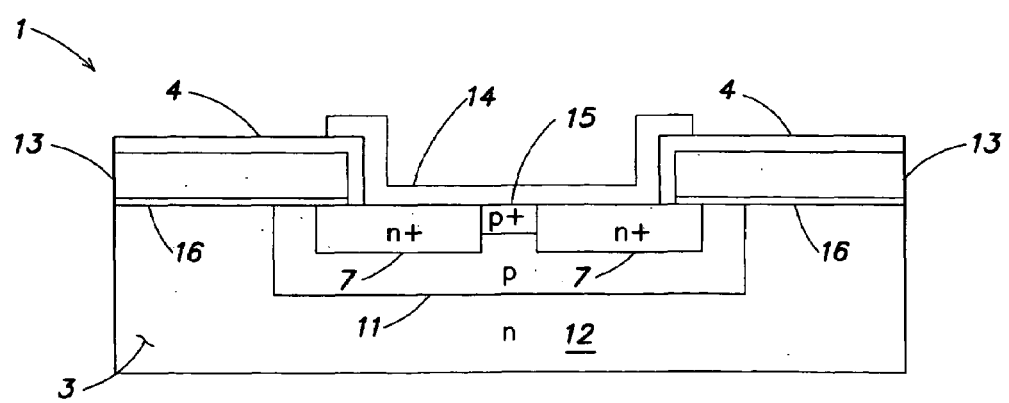
FIG. 6 is a cross-section through a DMOS transistor cell.

FIG. 6 shows a DMOS transistor device produced according to the method, in which device the substance is a dopant which is incorporated into a $p^+$ zone 15 for a freewheeling diode. The doping regions 7 located on both sides of the $p^+$ zone 15 are $n^+$ source regions which are embedded in a p-doped substrate region 11. This p-doped substrate region 11 is in turn embedded in an n-doped substrate region 12. Also visible in FIG. 6 are gate contacts 13, a passivation layer 4, a source contact 14, and a gate oxide layer 16.

In the method to produce the solid body 1 with the microstructure 2, the surface of the substrate 3 is thus provided with the masking layer 6 which is impermeable to the substance to be applied. The substance is then incorporated into substrate regions not covered by the masking layer 6. A heat treatment is used to diffuse the substance into a specific substrate region covered by the masking layer 6 such that a concentration gradient of the substance is created, proceeding from the edge of the masking layer inward with increasing distance from the edge. The masking layer 6 is subsequently removed to expose the substrate region below it, and a near-surface layer of the substrate 3 located in the exposed substrate region is converted by a chemical conversion reaction into the coating 9 which has a layer thickness profile corresponding to the concentration gradient of the substance contained in the near-surface layer. A supplementary treatment is implemented in a subsection of the coating 9 in which the thickness of the coating 9 has been reduced.

Although the present invention has been illustrated and described with respect to several preferred embodiments thereof, various changes, omissions and additions to the form and detail thereof, may be made therein, without departing from the spirit and scope of the invention.

The invention claimed is:

1. Method for producing a solid body including a microstructure, wherein the surface of a substrate is provided with a masking layer which is impermeable to a substance to be applied, and the substance is subsequently incorporated into substrate regions not covered by the masking layer, the method comprising the steps of:

heat treating a substrate region covered by the masking layer to diffuse the incorporated substance in the substrate region covered by the masking layer, such that a concentration gradient of the substance is created, proceeding from the edge of the masking layer inward with increasing distance from the edge, in the substrate region covered by the masking layer;

removing the masking layer to expose the substrate region below it;

converting a layer of the substrate near the surface in the exposed substrate region by a chemical conversion reaction into a coating with a layer thickness profile corresponding to the concentration gradient of the substance contained in this near-surface layer;

treating a subsection of the coating, the surface of which is smaller than the substrate surface covered by the original masking layer, and in which the thickness of the coating is reduced relative to the remaining subsections of the coating, in which treatment the substrate region covered by this subsection is exposed to provide an exposed subsection, and/or a material is incorporated into this substrate region through the coating, where during the removal of the masking layer, the substrate regions laterally adjacent to the masking layer are covered by an etching mask, and the masking layer is then contacted with an etching agent, and where a metallic layer is applied over the exposed subsection, and that the adhesive properties of the substrate material and of the coating are matched to the material of the surface layer such that the metallic layer adheres only to the exposed subsection of the substrate region.

2. The method of claim 1, where the etching mask is created by a chemical reaction in which a near-surface layer of the substrate regions to be covered by the etching mask is converted to an etching mask material.

3. The method of claim 2, where the etching mask is created during the heat treatment by thermal oxidation of the substrate material in an oxygen-containing atmosphere.

4. The method of claim 3, where the chemical conversion reaction is an oxidation reaction.

5. The method of claim 4, where the substrate region in which the masking layer has been removed, the near-surface layer of the substrate is converted by a chemical conversion reaction into an electrically insulating coating; and that, after the regional removal of the coating, the metal coating is electrolytically deposited on the exposed surface of the electrically conductive substrate region.

6. The method of claim 5, where the near-surface layer of the substrate is converted by a chemical conversion reaction to a coating which is impermeable to a chemical layer to be applied.

7. The method of claim 6, where the solid body is contacted by a medium, and that substrate material present in the exposed substrate region is converted by a chemical reaction with this medium into another material.

8. The method of claim 7, where after exposing the substrate region, the substrate region is contacted with an etching agent for the substrate material, to which the coating surrounding the substrate region is essentially chemically resistant, in order to insert a depression into the substrate region.

9. A method for producing a solid body including a semiconductor element, comprising:

depositing a passivation layer on a surface of a semiconductor substrate;

forming an opening in the passivation layer such that a section of the substrate surface is exposed;

forming a silicon nitride layer on the section and etching portions of the silicon nitride layer to form a masking layer on a subsection of the section of the substrate surface, where the subsection is spaced laterally within the opening from sidewalls of the passivation layer;

doping the substrate with a substance to form doping zones within the substrate, where the masking layer is impermeable to the substance;

heat treating the semiconductor substrate to diffuse the substance within the doping zones into a substrate region that underlies the masking layer and is between the doping zones;

forming oxide layers over regions of the substrate between the sidewalls of the passivation layer and not covered by the masking layer;

removing the masking layer to provide an exposed substrate region;

forming a silicon dioxide coating over the exposed substrate region, where the thickness of the silicon dioxide coating decreases towards the center of the exposed substrate region;

applying an etching agent to remove the silicon dioxide coating in a center region of the exposed substrate region, where the center region is smaller than the area covered by the masking layer; and electrodepositing a metal layer over the center region.

10. The method of claim 9, where the step of electrodepositing comprises a currentless technique.

11. The method of claim 9, where the substance comprises boron.

12. The method of claim 9, where the substance comprises phosphorus.

13. The method of claim 9, where upon completion of said step of heating there is a decrease in the concentration of the substance in the coverage plane of the doping regions, proceeding from the masking layer into the substrate region covered by the masking layer and with increasing distance from the edge of the masking layer.

14. A method for producing a solid body including a semiconductor element, comprising:

depositing a passivation layer on a surface of a semiconductor substrate;

forming an opening in the passivation layer such that a section of the substrate surface is exposed;

forming a silicon nitride layer on the section and removing portions of the silicon nitride layer to form a masking layer on a subsection of the section of the substrate surface, where the subsection is spaced laterally within the opening from sidewalls of the passivation layer;

doping the substrate with a dopant to form doping zones within the substrate, where the masking layer is impermeable to the dopant;

heat treating the semiconductor substrate in an oxygen environment to diffuse the substance within the doping zones into a substrate region that underlies the masking layer and is between the doping zones, and form oxide layers over regions of the substrate between the sidewalls of the passivation layer and not covered by the masking layer;

removing the masking layer to provide an exposed substrate region;

forming a silicon dioxide coating over the exposed substrate region, where the thickness of the silicon dioxide coating decreases towards the center of the exposed substrate region;

removing the silicon dioxide coating in a center region of the exposed substrate region, where the center region is smaller than the area covered by the masking layer; and electrolytically depositing a metal layer over the center region.

* * * * *